(12) United States Patent
Ni et al.

(10) Patent No.: US 10,749,020 B2
(45) Date of Patent: Aug. 18, 2020

(54) GROUP III-NITRIDE SEMICONDUCTOR DEVICE AND CORRESPONDING FABRICATING METHOD

(71) Applicant: Suzhou Han Hua Semiconductor Co.,Ltd, Suzhou (CN)

(72) Inventors: Xian-Feng Ni, Suzhou (CN); Qian Fan, Suzhou (CN); Wei He, Suzhou (CN)

(73) Assignee: SUZHOU HAN HUA SEMICONDUCTOR CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 16/361,314

(22) Filed: Mar. 22, 2019

(65) Prior Publication Data
US 2020/0052102 A1 Feb. 13, 2020

(30) Foreign Application Priority Data
Mar. 7, 2019 (CN) .......................... 2019 1 0170242

(51) Int. Cl.
*H01L 29/778* (2006.01)
*H01L 29/205* (2006.01)
*H01L 29/66* (2006.01)
*H01L 29/20* (2006.01)

(52) U.S. Cl.
CPC ...... *H01L 29/7786* (2013.01); *H01L 29/2003* (2013.01); *H01L 29/205* (2013.01); *H01L 29/66462* (2013.01)

(58) Field of Classification Search
CPC ... H01L 29/66462; H01L 29/778–7787; H01L 29/15–157; H01L 29/207
See application file for complete search history.

(56) References Cited

U.S. PATENT DOCUMENTS

| | | | | |
|---|---|---|---|---|
| 6,100,542 A | * | 8/2000 | Kohara | ............... H01L 29/7783 257/194 |
| 2010/0102359 A1 | * | 4/2010 | Khan | .................. H01L 21/0228 257/194 |

* cited by examiner

*Primary Examiner* — Zandra V Smith
*Assistant Examiner* — Molly K Reida
(74) *Attorney, Agent, or Firm* — Westerman, Hattori, Daniels & Adrian, LLP

(57) ABSTRACT

The invention relates to the group III-nitride semiconductor device and corresponding fabricating method. Specifically, a method to reduce RF dispersion in a group III-nitride high electron mobility transistor (HEMT), especially for reduced barrier thickness epi materials and scaled deices for higher frequency applications. Periodic n-type doping within barrier is used to screen surface state traps, which are responsible for the above-mentioned RF dispersion, without introducing additional gate leakage current path. Within the method, the barrier (typically AlGaN, AlInN) layer is periodically n-type doped with its composition (such as Al % within AlGaN) periodically modulated. The periodic structure is effective in both screening surface state traps and reducing the leakage current within the AlGaN/gate Schottky barrier. Therefore, the growth method could be used for fabricate the dispersion-free III-nitride based HEMT devices, which will be highly desirable for making high frequency materials and devices in the applications such as higher frequency wireless communications.

20 Claims, 4 Drawing Sheets

GROUP III-NITRIDE SEMICONDUCTOR DEVICE AND CORRESPONDING FABRICATING METHOD

TECHNICAL FIELD OF THE INVENTION

The present disclosure relates generally to Group III-nitride (GaN, AlN, InN, ScN, BN and/or their alloys) semiconductor device and corresponding fabricating method, and more particularly to III-Nitride on high-thermal-conductivity substrate epi materials and high electron mobility transistors (HEMTs).

BACKGROUND OF THE INVENTION

This invention is related to III-nitride based high electron mobility transistors (HEMT). Nitride materials include GaN, InN, and AlN, as well as the alloy materials such as AlGaN, InAlN, InGaN, etc. Due to their unique material properties, nitride materials especially AlGaN and InAlN are particularly suitable for HEMT devices capable of delivering high frequency, high power. The nitride based HEMT has found its applications in areas of mobile, satellite, radar communications, and proven its advantages over other semiconductor materials such as Si or GaAs.

The fabrication of GaN HEMT starts with epitaxy of nitride materials on substrates (typically SiC, Si, Sapphire, or GaN, etc) with metalorganic chemical vapor deposition (MOCVD) or molecular beam epitaxy (MBE). The typical epitaxy structure of nitride HEMT comprises of a nucleation layer (typically AlN or low-temperature GaN), a highly-resistive GaN template and barrier layer (such as AlGaN or AlInN). The epi wafer will be tested for essential materials properties. Once the epi wafer is characterized, and it will go through wafer fab process to form HEMT devices. Typically, ohmic contact metals (Ti/Al/Ni/Au) will be deposited on wafers and annealed to form ohmic contact with nitride materials. Then gate area is defined by typical photolithography process, and gate metal is subsequently deposited to the gate area to form gate contact. More advanced HEMT technologies will have different variations from the above-mentioned process. For example, technologies such as in-situ SiNx passivation, multiple 2DEG channels, different barrier materials, device isolation by dry etching, device passivation, field plate will be used for further improvement of device improvement.

One of the key factors for achieving high-performance radio-frequency (RF) performance of HEMT device is to minimize RF dispersion. The RF dispersion manifest itself as the discrepancy between the maximum channel current as well as knee voltage under microwave frequency and DC condition. Evidences have been shown that the dispersion is strongly related to surface-state charges. Surface passivation with SiNx films could partially mitigate the issue without completely eliminating it. In addition, SiNx passivation effect is very sensitive to both surface and SiNx deposition condition, therefore resulting in poor reproducibility and repeatability. In addition, the RF dispersion issue becomes more severe once the barrier thickness is reduced (i.e., for higher frequency applications), which brings the electron in 2DEG closer to surface, therefore the RF dispersion issue requires a different approach. As an alternative effort to address the RF dispersion issue, Oleg M. eta [1] reported a Si-doped AlGaN barrier could reduce RF dispersion at the price of an increased gate leakage, which essentially solves one problem yet creates another worse one. The current solution needs improvement. Here in the present invention, we disclose a method to fabricate dispersion-free nitride HEMT devices without a significant increase of gate leakage.

SUMMARY OF THE INVENTION

In this invention, periodic n-type doping is introduced to a composition-modulated barrier to achieve the above purpose. The modulations for both doping and Al composition within the barrier layer could significantly reduce the gate leakage within the barrier while achieving the RF dispersion minimization.

One main embodiment of this invention is a Group III-Nitride semiconductor device. In this embodiment, a buffer layer is formed on a substrate and a barrier layer formed on the buffer layer, wherein the barrier layer consists of a plurality of repetitive cycles that each cycle consists of n sub-layers, and wherein the barrier layer is made of n-type doped nitride with modulated n-type doping levels and modulated additional Group III element compositions.

In some related embodiments, the energy band gap of the barrier layer is larger than the energy band gap of the buffer layer.

In some related embodiments, the material of the barrier layer is chosen from a group consisting of AlGaN, AlInN, AlGaInN, InN, ScN, BN and combination thereof.

In some related embodiments, the N-type doping level is inversely proportional to the additional group III element composition for each sub-layer.

In some related embodiments, one option is that the additional group III element composition and the N-type doping level are decreased from the bottom of the barrier layer to the top of the barrier layer, and another option is that the additional group III element composition and the N-type doping level are increased from the bottom of the barrier layer to the top of the barrier layer.

In some related embodiments, at least two sub-layers have different additional group III element composition for each cycle, and at least two sub-layers have different N-type doping level for each cycle.

In some related embodiments, the additional group III element composition is decreased from high to low, and the N-type doping level is increased from low to high values from bottom of the barrier layer toward the opposite surface of the barrier layer during a cycle, wherein each cycle have same combination of additional Group III element composition and N-type doping level among the sub-layers.

In some related embodiments, the additional group III element composition is increased from low to high, and the N-type doping level is decreased from high to low values from bottom of the barrier layer toward the opposite surface of the barrier layer during a cycle, wherein each cycle have same combination of additional Group III element composition and N-type doping level among the sub-layers.

In some related embodiments, one option is that the thickness of each sub-layer is in the range of 0.1 nm to 50 nm, another option is that the doping level of each sub-layer is in the range of $1 \times 10^{14}$ cm$^{-3}$ to $1 \times 10^{21}$ cm$^{-3}$, and one more option is that the total number of cycles with the barrier layer is in the range of 1 to 50.

In some related embodiments, one option is that the n-type dopant being chosen from a group consisting of Si, Ge and combination thereof. Further, whether the n-type doping is applied to or not applied to the top sub-layer of the barrier layer are all optional. Similarly, whether the n-type doping is applied to or not applied to the bottom sub-layer of the barrier layer are all optional.

In some related embodiments, a nitride cap layer formed on the top of the barrier layer.

Another main embodiment of the invention is a method of fabricating Group III-Nitride semiconductor device. The first step of the main embodiment is forming a buffer layer on a substrate, and The second step of the main embodiment is forming a barrier layer on the buffer layer by using the modulating doping. Further, the formed barrier layer consists of a plurality of repetitive cycles that each consists of n sub-layers and is made of n-type doped nitride with modulated n-type doping levels and modulated additional Group III element compositions on the buffer layer.

In some related embodiments, an option is forming the barrier layer by using the material whose energy band gap is larger than the energy band gap of the buffer layer. Another option is forming the barrier layer by using the material chosen from a group consisting of AlGaN, AlInN, AlGaInN, InN, ScN, BN and combination thereof.

In some related embodiments, one option is adjusting the modulating doping so that at the N-type doping level is inversely proportional to the additional group III element composition for each sub-layer, another option is adjusting the modulating doping so that at least two sub-layers are adjusted to have different additional group III element composition for each cycle, and one more option is adjusting the modulating doping so that at least two sub-layers ae adjusted to have different N-type doping level for each cycle.

In some related embodiments, one option is adjusting the modulating doping so that the additional group III element composition and the N-type doping level are decreased from the bottom of the barrier layer to the top of the barrier layer, and another option is adjusting the modulating doping so that the additional group III element composition and the N-type doping level are increased from the bottom of the barrier layer to the top of the barrier layer.

In some related embodiments, one option is adjusting the modulating doping so that the additional group III element composition is decreased from high to low, and the N-type doping level is increased from low to high values from bottom of the barrier layer toward the opposite surface of the barrier layer during a cycle, and wherein each cycle have same combination of additional Group III element composition and N-type doping level among the sub-layers; and another option is adjusting the modulating doping so that the additional group III element composition is increased from low to high, and the N-type doping level is decreased from high to low values from bottom of the barrier layer toward the opposite surface of the barrier layer during a cycle, and wherein each cycle have same combination of additional Group III element composition and N-type doping level among the sub-layers.

In some related embodiments, one option is keeping the thickness of each sub-layer in the range of 0.1 nm to 50 nm, another option is keeping the doping level of each sub-layer in the range of $1\times10^{14}$ cm$^{-3}$ to $1\times10^{21}$ cm$^{-3}$; and one more option is keeping the total number of cycles with the barrier layer in the range of 1 to 50.

In some related embodiments, selecting the n-type dopant used by the n-type doping from a group consisting of Si, Ge and combination thereof. Three more options are processing the n-type doping by using the SiH$_4$ gas to provide a plurality of n-type dopants, processing the n-type doping by using the Si$_2$H$_6$ gas to provide a plurality of n-type dopants, and processing the n-type dopant by using the Germane gas to provide a plurality of n-type dopants respectively.

In some related embodiments, whether apply or not apply the n-type doping to the top sub-layer of the barrier layer is all optional. Similarly, whether apply or not apply the n-type doping to the bottom sub-layer of the barrier layer also is all optional.

In some related embodiments, an option is forming a nitride cap layer on the top of the barrier layer.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

BRIEF DESCRIPTION OF THE PREFERRED EMBODIMENTS

The present application proposes a semiconductor structure comprising: a1 a substrate including, but not limited to, materials such as sapphire, silicon carbide, silicon, diamond, gallium arsenide, gallium nitride, and aluminum nitride. The substrate has a thickness of 50 to 1000 microns. A buffer layer may be formed on the substrate, and the buffer layer has a thickness of 50 to 10,000 nm. A barrier layer may be formed on the buffer layer, and the barrier layer has a thickness of 3 to 100 nm. The program in which the buffer layer is in contact with the barrier layer is formed with a two-dimensional electron gas (2DEG) that provides a device conductive channel. The barrier layer material may be, but not limited to, AlGaN, AlInN, AlGaInN, or the like. The buffer layer material may be, but not limited to, GaN, InGaN, AlGaN, AlGaInN, or the like. The buffer layer material may also be a combination of layers such as AlN/GaN. The energy band gap of the barrier layer material needs to be larger than the buffer layer material.

Figure 1:
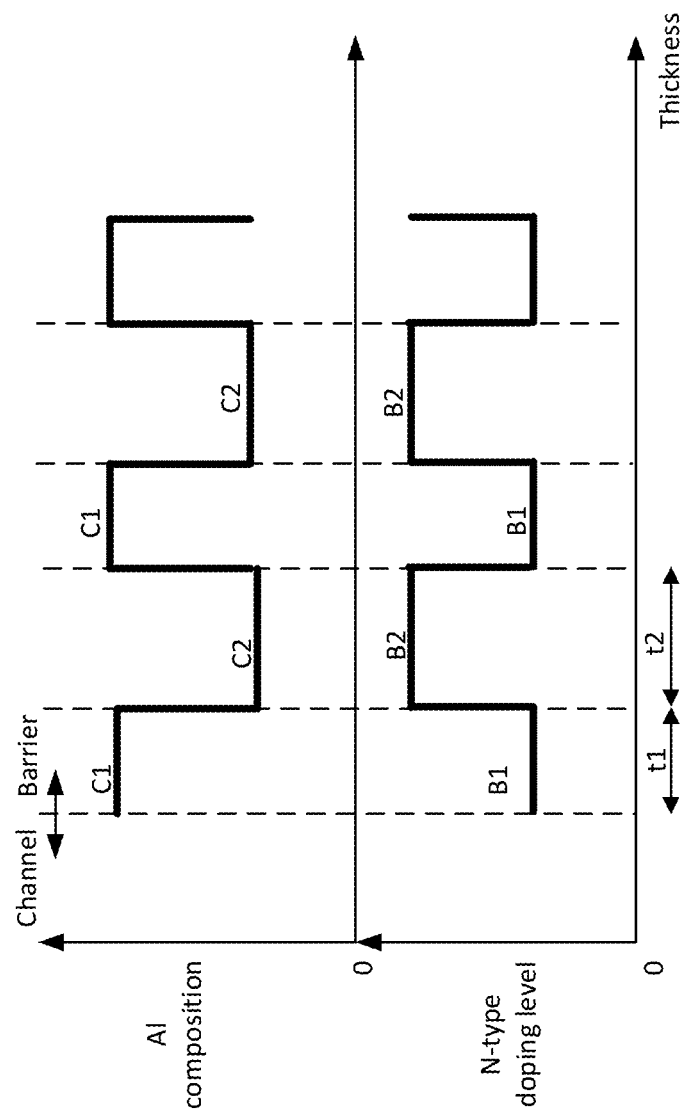
FIG. 1 illustrates the schematic for Al composition and N-type doping levels within the AlGaN barrier with periodic Si doping and Al composition modulation.

In one embodiment, the barrier within HEMT is composed of periodic barrier sub-layers with the modulated n-type doping levels and Al compositions as shown FIG. 1. The Si doping is introduced to layers with relatively lower Al composition to achieve reasonable electrons concentrations due to relatively lower ionization level for dopant with lower Al composition. The thicknesses for the two sub-layers within one cycle are t1 and t2, respectively. The Al and N-type doping level within the t1 sub-layer are C1 and B1, while the values for the t2 layer are C2 and B2. C1 is higher than or equal to C2, and the B1 is lower than or equal to B2. The t1 and t2 layer thicknesses are both in the range of 0.1 nm to 50 nm. The B1 and B2 doping levels are both in the range of $1\times10^{14}$ cm$^{-3}$ to $1\times10^{21}$ cm$^{-3}$. One cycle of AlGaN sub-layers is composed of one t1 and one t2 layers. The total number of cycles within the barrier is typically in the range of 1 to 50. Each cycle could have same combination of Al composition and doping levels. The n-type dopant includes Si (using SiH$_4$ or Si$_2$H$_6$ gases), or Ge (Germane), or a co-doping using Si and Ge. Preferably, the n-type doping is not applied to the top AlGaN sub-layer which is in direct contact with gate metal to have low gate leakage current. In addition, by alternating Al composition and n-type doping levels as shown in FIG. 1, we created sub-layers within the barrier with alternating higher and lower resistivity values. This is beneficial for reducing gate leakage current in vertical direction, where the higher resistive layer with higher Al composition and no N-type doping serve as effective gate leakage block layers. In the other hand, the periodically distributed n-type doping within the lower Al composition barrier creates multiple screening barriers for surface trap charges, thereby effectively minimizing the RF dispersion. The barrier materials could be but not limited to AlGaN, AlInN, AlGaInN etc. The channel materials could be but not limited to GaN, InGaN, AlGaN, AlGaInN etc. The channel materials could also be a combination of multiple layers such as AlN/GaN, InGaN/GaN etc. Optionally, a nitride cap layer (such as GaN) could be deposited on top of barrier for improving source and drain contact resistance.

Figure 2:
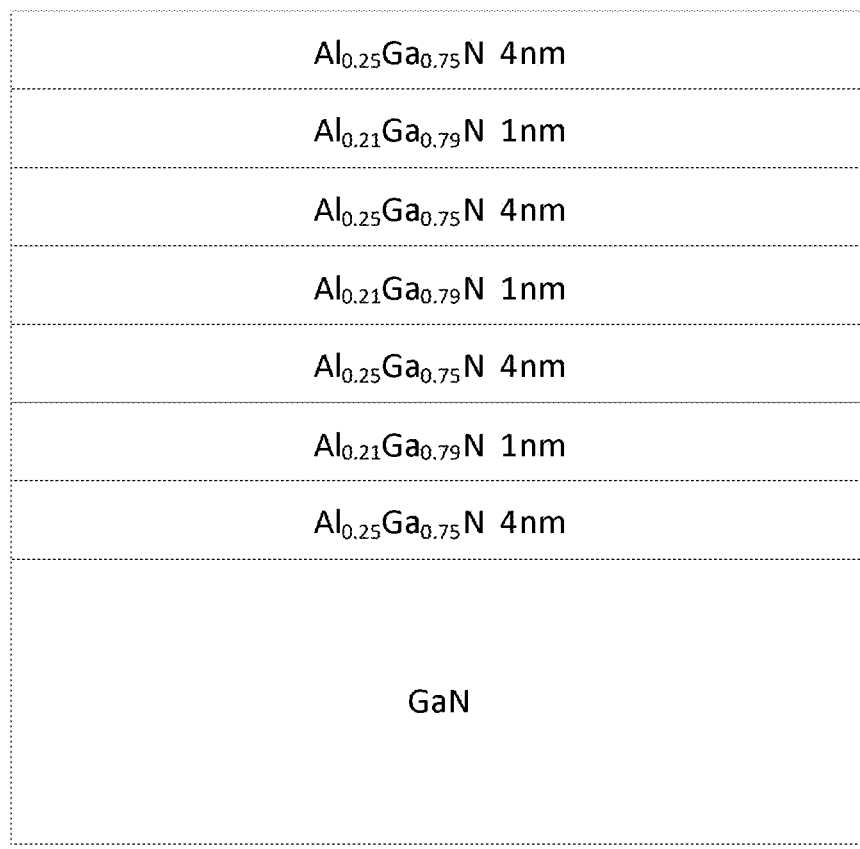
FIG. 2 illustrates an example of the AlGaN/GaN HEMT with Si periodic a2 doping as well as Al % modulation: in this example, AlGaN barrier has three Si doped Al$_{0.20}$Ga$_{0.80}$N sub-layers sandwiched between un-doped Al$_{0.25}$Ga$_{0.75}$N layers. The top AlGaN layer is un-doped.

FIG. 2 shows an example of the above-disclosed device scheme. As a4 shown in FIG. 2, the two sub-layers have Al composition of 25% and 20%, respectively. The AlGaN layers with 20% Al composition are doping with Si to $2\times10^{19}$ cm$^{-3}$. The AlGaN layers with 25% Al composition are doping with Si to $2\times10^{15}$ cm$^{-3}$. The thickness for the two sub-layers are 4 nm and 1 nm within one cycle, respectively. The sub-layer doping level of the higher Al component is lower in one cycle. The total AlGaN barrier thickness is 19 nm in this particular example. The top AlGaN sub-layer Al$_{0.25}$Ga$_{0.75}$N is 4 nm and un-doped.

Figure 3:
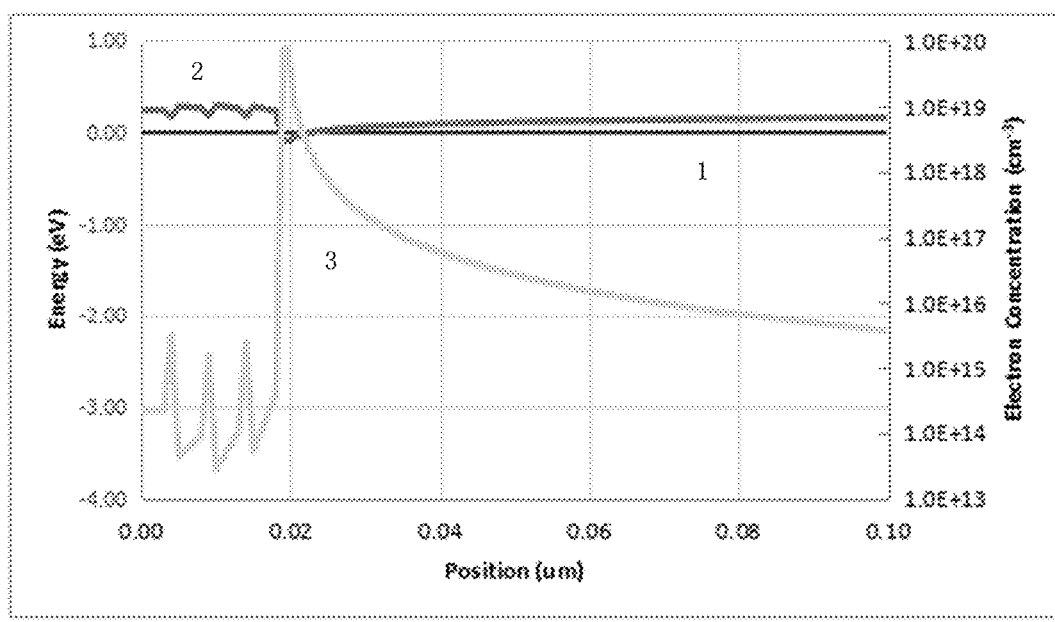
FIG. 3 illustrates the band diagram of an example of the disclosed a3 HEMT structure described in FIG. 2: the barrier is composed of (Al$_{0.25}$Ga$_{0.75}$N:undoped/Al$_{0.20}$Ga$_{0.80}$N:Si) x3. The Al$_{0.20}$Ga$_{0.80}$N layer is 1 nm thick with a Si doping level of $2\times10^{19}$ cm$^{-3}$. The 2DEG concentration is $1.0\times10^{13}$ cm$^{-2}$.

FIG. 3 shows the band diagram of the device structure described in FIG. 2. The abscissa indicates the position (the origin position indicates the top surface of the barrier layer), one ordinate indicates the energy level (ev), and the other ordinate indicates the electron concentration per unit volume (cm$^3$). Curve 1 represents the Fermi level, curve 2 represents the conduction band of the material, and curve 3 represents the electron concentration. Only when the conduction band of the material is smaller than the Fermi level, the electrons distributed at the position can form a 2DEG. The position is the location of the conductive channel. Therefore, as can be seen from the figure, the channel electron concentration is around $1.0\times10^{19}$ cm$^{-3}$, so the particular example has a 2DEG concentration of $1.0\times10^{13}$ cm$^{-2}$, which is comparable to the 2DEG concentration of a similar HEMT with a 19 nm-thick Al$_{0.25}$Ga$_{0.75}$N barrier ($9.0\times10^{12}$ cm$^{-2}$). As shown in the diagram, over 99% of electron concentration is distributed within the GaN channel, while the electron concentration within the Si-doped AlGaN is near ~$2\times10^{15}$ cm$^{-3}$, which is negligible as compared to the 2DEG concentration within the GaN channel.

Figure 4:
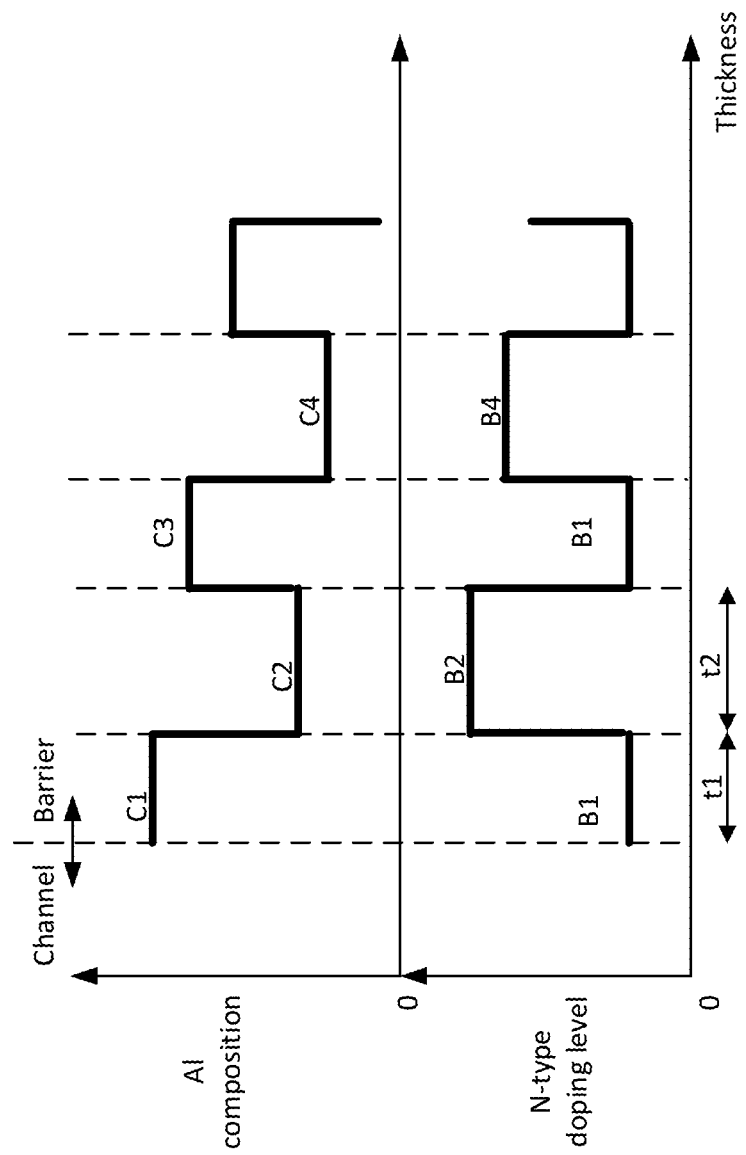
FIG. 4 illustrates the schematic for another scheme of the Al composition and N-type doping levels within the AlGaN barrier with periodic doping and Al composition modulation.

In another scheme, each cycle within the barrier has graded Al composition and Si doping levels: for example, as shown in FIG. 4, the Al composition and Si doping level are graded for the t1 and t2 layers from high to low values towards barrier top surface. The Al composition C1 is higher than C3, and both C1 and C3 are higher than C2. The Al composition for each cycle is repeated in the same fashion. The n-type doping level B2 is higher than B4, while both B2 and B4 are higher than B1. Similarly, t1 and t2 are both in the range of 0.1 nm to 50 nm. The B1 and B2 doping levels are both in the range of $1\times10^{14}$ cm$^{-3}$ to $1\times10^2$ cm$^{-3}$. One cycle of sub-layers is composed of one t1 and one t2 layers. The total number of cycles within the barrier is typically in the range of 1 to 50. Each cycle could have same combination of Al composition and doping levels. Preferably, the n-type doping is not applied to the top sub-layer which is in direct contact with gate metal to have low gate leakage current.

Figure 5:
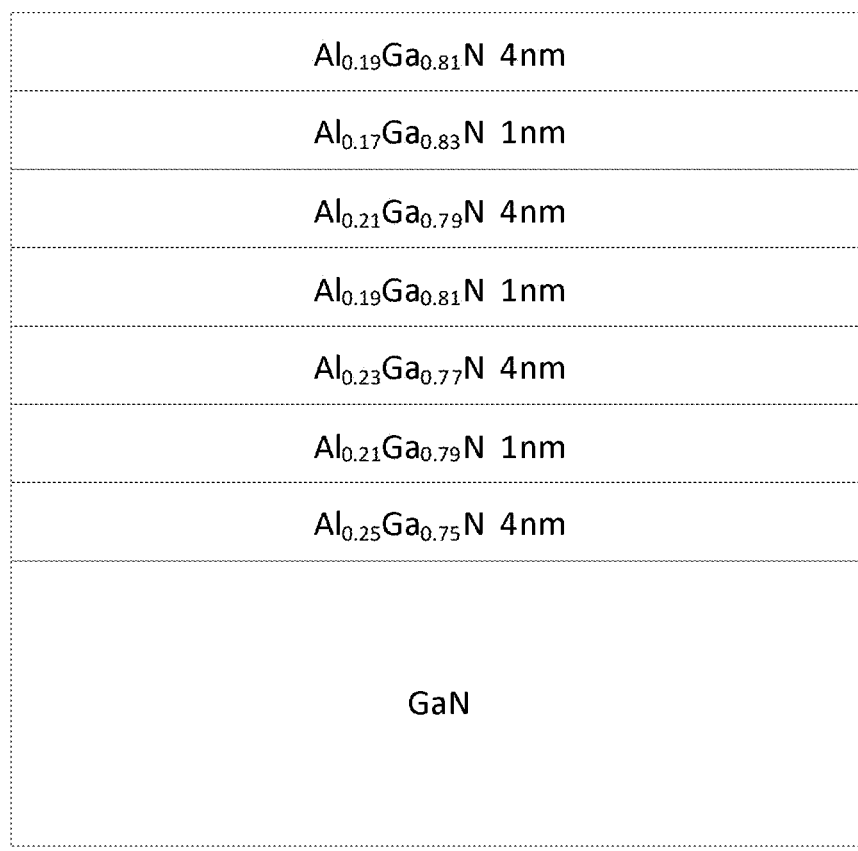
FIG. 5 illustrates an example of the AlGaN/GaN HEMT with Si periodic doping as well as graded Al composition (high to low from bottom to surface): in this example, AlGaN barrier has three Si doped AlGaN sandwiched between un-doped AlGaN layers. The three AlGaN layers' doping levels are graded: $3\times10^{19}$ cm$^{-3}$ $2\times10^{19}$ cm$^{-3}$, $1\times10^{19}$ cm$^{-3}$ for the three AlGaN sub-layers (from bottom to top surface), respectively.

FIG. 5 shows an example design of the scheme in FIG. 4 The barrier layer includes 3 cycles, each combined layer includes two sub-layers, wherein the first cycle includes a first sub-layer and a second sub-layer, and the second cycle 52 includes a third sub-layer and a fourth sub-layer, and the third cycle includes a fifth sub-layer and a sixth sub-layer. The first sub-layer has an Al composition of 25%, an n-type doping level of $2\times10^{15}$ cm$^{-3}$ and a thickness of 4 nm; the second sub-layer has an Al composition of 21%, and the n-type doping level is $3\times10^{19}$ cm$^{-3}$ and a thickness of 1 nm; the third sub-layer has an Al composition of 23%, an n-type doping level of $2\times10^{15}$ cm$^{-3}$ and a thickness of 4 nm; and the Al component of the fourth sub-layer 19%, the n-type doping level is $2\times10^{15}$ cm$^{-3}$, the thickness is 1 nm; the fifth sub-layer has an Al composition of 21%, an n-type doping level of $2\times10^{15}$ cm$^{-3}$, and a thickness of 4 nm; The sixth sublayer has an Al composition of 17%, an n-type doping level of $1\times10^{19}$ cm$^{-3}$, and a thickness of 1 nm. The sub-layer doping level of the higher Al component is lower in one cycle. Within the different cycles, from the bottom to the top of the barrier layer, the Al composition gradually decreases, and the doping concentration also gradually decreases. The barrier layer further comprises a top sub-layer, preferably undoped or doped, having a thickness of 4 nm.

Figure 6:
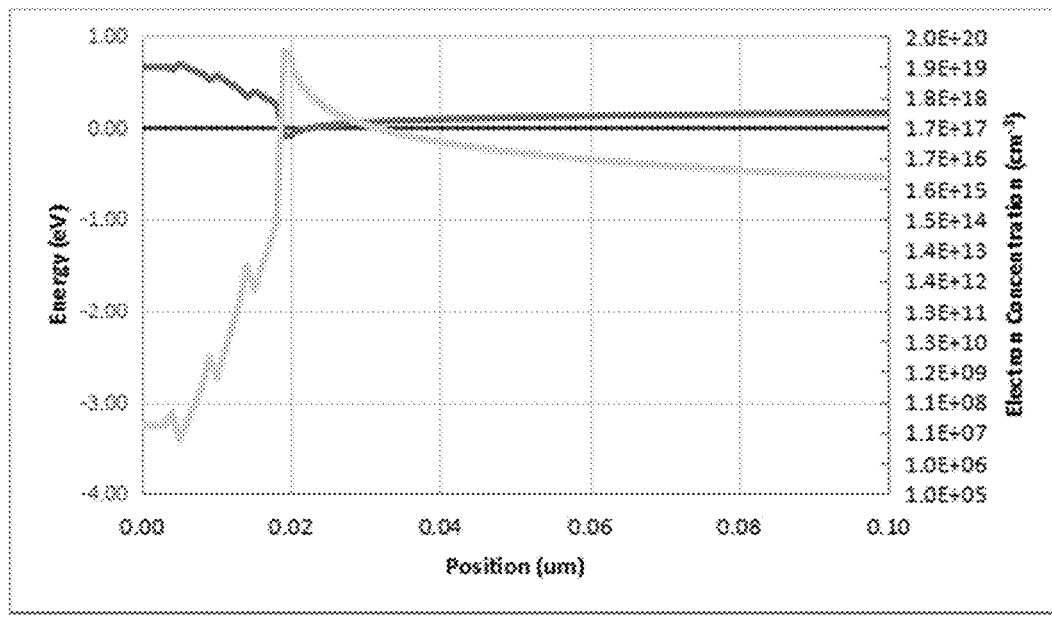
FIG. 6 illustrates the band diagram of an example of the disclosed HEMT structure described in FIG. 5: The 2DEG concentration is $9.0\times10^{12}$ cm$^{-2}$.

FIG. 6 shows the band diagram of the device structure described in FIG. 5. The particular example has a 2DEG concentration of $9.0\times10^{12}$ cm$^{-2}$, which is similar to the example device described in FIG. 2. The majority of 2DEG is also from the GaN channel layer as judged from the electron concentration distribution (in FIG. 6). The relatively lower Al composition toward the top barrier surface is beneficial for reducing the contact resistance for source and drain (R$_{on}$), while the relatively higher Al composition near the GaN channel is helpful for producing higher 2DEG concentration and thereby higher channel conductance.

In another scheme, each cycle within the barrier has graded Al composition and n-type doping levels, but with the grading directions being opposite to the scheme described in FIG. 4. Due to the similarity in nature to the above schemes, we will not go into further details for the scheme.

Although the invention has been illustrated and described with respect to several preferred embodiments thereof, various changes, omissions and additions to the form and detail thereof, may be made therein, without departing from the spirit and scope of the invention. Modifications and changes may be made within the scope of the invention, which is defined by the appended claims.

What is claimed:

1. A Group III-Nitride semiconductor device, comprising:
   a buffer layer formed on a substrate; and
   a barrier layer formed on the buffer layer;
   wherein the barrier layer consists of a plurality of repetitive cycles that each cycle consists of n sub-layers, the barrier layer is made of n-type doped nitride with modulated n-type doping levels and modulated additional Group III element compositions, and an n-type doping level in a sub-layer having a higher energy band is lower than an n-type doping level in a sub-layer having a lower energy band in at least one of the repetitive cycles.

2. The device of claim 1, wherein the energy band gap of the barrier layer is larger than the energy band gap of the buffer layer.

3. The device of claim 1, wherein the material of the barrier layer is chosen from a group consisting of AlGaN, AlIaN, AlGaInN, InN, ScN, BN and combination thereof.

4. The device of claim 1, wherein the N-type doping level is inversely proportional to the additional group III element composition for each sub-layer.

5. The device of claim 1, further comprising at most one of the following:
   the additional group III element composition and the N-type doping level being decreased from the bottom of the barrier layer to the top of the barrier layer; and
   the additional group III element composition and the N-type doping level being increased from the bottom of the barrier layer to the top of the barrier layer.

6. The device of claim 1, wherein at least two sub-layers have different additional group III element composition for each cycle, and wherein at least two sub-layers having different N-type doping level for each cycle.

7. The device of claim 1, wherein the additional group III element composition is decreased from high to low, and the N-type doping level is increased from low to high values from bottom of the barrier layer toward the opposite surface of the barrier layer during a cycle, and wherein each cycle have same combination of additional Group III element composition and N-type doping level among the sub-layers.

8. The device of claim 1, wherein the additional group III element composition is increased from low to high, and the N-type doping level is decreased from high to low values from bottom of the barrier layer toward the opposite surface of the barrier layer during a cycle, and wherein each cycle have same combination of additional Group III element composition and N-type doping level among the sub-layers.

9. The device of claim 1, further comprising one or more of the following:
   the thickness of each sub-layer being in the range of 0.1 nm to 50 nm;
   the doping level of each sub-layer being in the range of $1 \times 10^{14}$ cm$^{-3}$ to $1 \times 10^{21}$ cm$^{-3}$; and
   the total number of cycles with the barrier layer being in the range of 1 to 50.

10. The device of claim , further comprising at least one of the following:
    the n-type dopant being chosen from a group consisting of Si, Ge and combination thereof;
    the n-type doping being not applied to the top sub-layer of the barrier layer;
    the n-type doping being applied to the top sub-layer of the barrier layer;
    the n-type doping being applied to the bottom sub-layer of the barrier layer; and
    the n-type doping being not applied to the bottom sub-layer of the barrier layer.

11. The device of claim 1, further comprising a nitride cap layer formed on the top of the barrier layer.

12. A method of fabricating Group III-Nitride semiconductor device, comprising:
    forming a buffer layer on a substrate; and
    forming a barrier layer on the buffer layer by using the modulating doping;
    wherein the barrier layer consists of a plurality of repetitive cycles that each consists of n sub-layers and is made of n-type doped nitride with modulated n-type doping levels and modulated additional Group III element compositions on the buffer layer, and an n-type doping level in a sub-layer having a higher energy band is lower than an n-type doping level in a sub-layer having a lower energy band in at least one of the repetitive cycles.

13. The method of claim 12, further comprising at least one of the following:
    forming the barrier layer by using the material whose energy band gap is larger than the energy band gap of the buffer layer; and
    forming the barrier layer by using the material chosen from a group consisting of AlGaN, AlInN, AlGaInN, InN, ScN, BN and combination thereof.

14. The method of claim 12, further comprising at least one of the following:
    adjusting the modulating doping so that at the N-type doping level is inversely proportional to the additional group III element composition for each sub-layer;
    adjusting the modulating doping so that at least two sub-layers are adjusted to have different additional group III element composition for each cycle; and
    adjusting the modulating doping so that at least two sub-layers ae adjusted to have different N-type doping level for each cycle.

15. The method of claim 12, further comprising at most one of the following:
    adjusting the modulating doping so that the additional group III element composition and the N-type doping level are increased from the bottom of the barrier layer to the top of the barrier layer;
    adjusting the modulating doping so that the additional group III element composition and the N-type doping level are decreased from the bottom of the barrier layer to the top of the barrier layer.

16. The method of claim 12, further comprising at most one of the following:
    adjusting the modulating doping so that the additional group III element composition is decreased from high to low, and the N-type doping level is increased from low to high values from bottom of the barrier layer toward the opposite surface of the barrier layer during a cycle, and wherein each cycle have same combination of additional Group III element composition and N-type doping level among the sub-layers; and
    adjusting the modulating doping so that the additional group III element composition is increased from low to high, and the N-type doping level is decreased from high to low values from bottom of the barrier layer toward the opposite surface of the barrier layer during a cycle, and wherein each cycle have same combination of additional Group III element composition and N-type doping level among the sub-layers.

17. The method of claim 12, further comprising one or more of the following:
    keeping the thickness of each sub-layer in the range of 0.1 nm to 50 nm;
    keeping the doping level of each sub-layer in the range of $1\times10^{14}$ cm$^{-3}$ to $1\times10^{21}$ cm$^{-3}$; and
    keeping the total number of cycles with the barrier layer in the range of 1 to 50.

18. The method of claim 12, further comprising at least one of the following:
    selecting the n-type dopant used by the n-type doping from a group consisting of Si, Ge and combination thereof;
    processing the n-type doping by using, the SiH$_4$ gas to provide a plurality of n-type dopants;
    processing the n-type doping by using the Si$_2$H$_6$ gas to provide a plurality of n-type dopants; and
    processing the n-type dopant by using the Germane gas to provide a plurality of n-type dopants.

19. The method of claim 12, further comprising at least one of the following:
    not applying the n-type doping to the top sub-layer of the barrier layer;
    applying the n-type doping is to the top sub-layer of the barrier layer;
    applying the n-type doping to the bottom sub-layer of the barrier layer; and
    not applying the n-type doping to the bottom sub-layer of the barrier layer.

20. The method of claim 13, further comprising forming a nitride cap layer or the top of the barrier layer.

* * * * *